US009685961B2

(12) United States Patent
Chu et al.

(10) Patent No.: US 9,685,961 B2
(45) Date of Patent: Jun. 20, 2017

(54) HIGH RESOLUTION TIMING DEVICE AND RADAR DETECTION SYSTEM HAVING THE SAME

(71) Applicant: HTC Corporation, Taoyuan County (TW)

(72) Inventors: Ta-Shun Chu, Hsinchu (TW); Ta-Chun Pu, Taoyuan County (TW); Chun-Yih Wu, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 387 days.

(21) Appl. No.: 14/488,309

(22) Filed: Sep. 17, 2014

(65) Prior Publication Data

US 2016/0077193 A1    Mar. 17, 2016

(51) Int. Cl.
| | |
|---|---|
| *G01S 13/02* | (2006.01) |
| *H03L 7/08* | (2006.01) |
| *H03L 7/23* | (2006.01) |
| *G01S 7/03* | (2006.01) |

(52) U.S. Cl.
CPC ............... *H03L 7/08* (2013.01); *G01S 7/032* (2013.01); *H03L 7/23* (2013.01)

(58) Field of Classification Search
CPC ...................................... G01S 7/032
USPC .................................. 342/175, 195
See application file for complete search history.

(56) References Cited

U.S. PATENT DOCUMENTS

| 6,359,950 B2 | 3/2002 | Gossmann et al. | |
|---|---|---|---|
| 8,599,984 B2 | 12/2013 | Vlasenko et al. | |
| 2009/0060107 A1* | 3/2009 | Fischer | H04L 7/08 375/355 |

OTHER PUBLICATIONS

LMK04816 Three Input Low-Noise Clock Jitter Cleaner with Dual Loop PLLs (Texas Instruments, LMK04816, Apr. 2013).
High-resolution on-chip propagation delay detector for measuring within-chip and chip-to-chip variation (Matsumoto, T., VLSI Circuits, 2004. Digest of Technical Papers. 2004 Symposium on , IEEE, pp. 252-255, Jun. 17-19, 2004).
Low-jitter process-independent DLL and PLL based on self-biased techniques (Maneatis, J.G., Solid-State Circuits, IEEE Journal of , vol. 31, No. 11, pp. 1723-1732, Nov. 1996).
Programmable video clock synthesizer with sub 0.5 ns drift (Lahuec, C. et al, Circuits and Systems, 2002. ISCAS 2002. IEEE International Symposium on , vol. 4, No., pp. IV-783-IV-786 vol. 4, 2002).

(Continued)

*Primary Examiner* — Timothy A Brainard
(74) *Attorney, Agent, or Firm* — CKC & Partners Co., Ltd.

(57) ABSTRACT

A high resolution timing device is provided. The high resolution timing device includes a first and a second clock delay circuits. The first clock delay circuit receives an input reference clock signal to generate a first multiple frequency output clock signal, divide the first multiple frequency output clock signal to generate a first original frequency output clock signal and perform a clock-delaying process thereon according to the first multiple frequency output clock signal to generate first clock-delayed signals. The second clock delay circuit receives one of the first clock-delayed signals to generate a second multiple frequency output clock signal, divide the second multiple frequency output clock signal to generate a second original frequency output clock signal and perform the clock-delaying process thereon according to the second multiple frequency output clock signal to generate second clock-delayed signals.

20 Claims, 4 Drawing Sheets

(56) References Cited

OTHER PUBLICATIONS

A multi standard single-chip transceiver covering 5.15 to 5.85GHz (Schwanenberger, T. et al, Solid-State Circuits Conference, 2003. Digest of Technical Papers. ISSCC. 2003 IEEE International , vol., No., pp. 350-498 vol. 1, 13-13, Feb. 2003).

Disruptive design solutions for frequency generation in silicon RFIC (Deval, Y. et al, Radio-Frequency Integration Technology: Integrated Circuits for Wideband Communication and Wireless Sensor Networks, 2005. Proceedings. 2005 IEEE International Workshop on , vol., No., pp. 97-100, Nov. 30-Dec. 2, 2005).

Corresponding Taiwanese Notice of Allowance that these art references were cited on Jan. 21, 2016.

* cited by examiner

HIGH RESOLUTION TIMING DEVICE AND RADAR DETECTION SYSTEM HAVING THE SAME

BACKGROUND

Field of Invention

The present invention relates to a clock generation technology. More particularly, the present invention relates to a high resolution timing device and a radar detection system having the same.

Description of Related Art

In electronic systems, signal processing is performed based on a clock signal. For example, an analog signal is received by being sampled based on the clock signal such that a digital signal is generated according to the sampled values. As a result, a high frequency clock signal or a clock delay of high resolution can be used to perform a high resolution sampling on the analog signal. Take a radar detection system as an example, if a clock signal with a higher resolution is used to perform signal transmission and receiving to further obtain information of distance or displacement of an object, a more precise distance or displacement difference can be detected.

However, under the limitation of the current fabrication process and technology, the selection of the frequency of the clock signal has an upper limit. In order to satisfy the need of high sampling resolution, a clock signal of even higher resolution is needed to perform the signal processing. Accordingly, what is needed is a high resolution timing device and a radar detection system having the same to address the above issues.

SUMMARY

An aspect of the present invention is to provide a high resolution timing device. The high resolution timing device includes a first clock delay circuit and a second clock delay circuit. The first clock delay circuit includes a first phase-locked loop module and a first clock delay module. The first phase-locked loop module receives an input reference clock signal having an input frequency to generate a first multiple frequency output clock signal having a first frequency of a first multiple of the input frequency and divides the first multiple frequency output clock signal to generate a first original frequency output clock signal having the input frequency. The first clock delay module receives the first multiple frequency output clock signal and the first original frequency output clock signal so as to perform a clock-delaying process on the first original frequency output clock signal according to the first multiple frequency output clock signal to generate a plurality of first clock-delayed signals each having the input frequency. The second clock delay circuit includes a second phase-locked loop module and a second clock delay module. The second phase-locked loop module receives one of the first clock-delayed signals to generate a second multiple frequency output clock signal having a second frequency of a second multiple of the input frequency and divides the second multiple frequency output clock signal to generate a second original frequency output clock signal having the input frequency. The second clock delay module receives the second multiple frequency output clock signal and the second original frequency output clock signal to perform the clock-delaying process on the second original frequency output clock signal according to the second multiple frequency output clock signal to generate a plurality of second clock-delayed signals each having the input frequency.

Another aspect of the present invention is to provide a radar detection system. The radar detection system includes a high resolution timing device, an antenna array device and a receiving device. The high resolution timing device includes a first clock delay circuit and a second clock delay circuit. The first clock delay circuit includes a first phase-locked loop module and a first clock delay module. The first phase-locked loop module receives an input reference clock signal having an input frequency to generate a first multiple frequency output clock signal having a first frequency of a first multiple of the input frequency and divides the first multiple frequency output clock signal to generate a first original frequency output clock signal having the input frequency. The first clock delay module receives the first multiple frequency output clock signal and the first original frequency output clock signal so as to perform a clock-delaying process on the first original frequency output clock signal according to the first multiple frequency output clock signal to generate a plurality of first clock-delayed signals each having the input frequency. The second clock delay circuit includes a second phase-locked loop module and a second clock delay module. The second phase-locked loop module receives one of the first clock-delayed signals to generate a second multiple frequency output clock signal having a second frequency of a second multiple of the input frequency and divides the second multiple frequency output clock signal to generate a second original frequency output clock signal having the input frequency. The second clock delay module receives the second multiple frequency output clock signal and the second original frequency output clock signal to perform the clock-delaying process on the second original frequency output clock signal according to the second multiple frequency output clock signal to generate a plurality of second clock-delayed signals each having the input frequency. The antenna array device receives a plurality of wireless input signals. The receiving device includes a plurality of sampling modules electrically connected to the antenna array device to respectively sample the wireless input signals according to one of the second clock-delayed signals.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
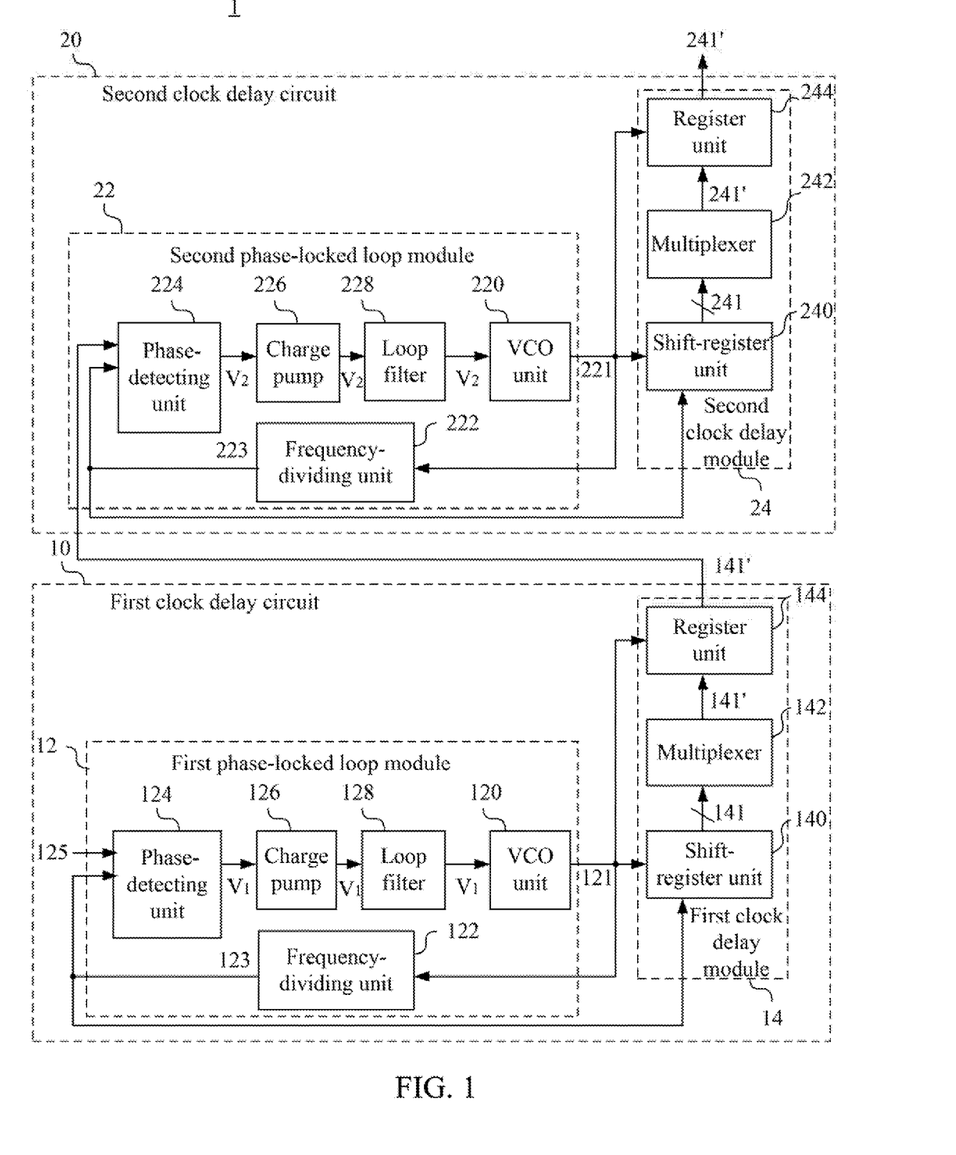
FIG. 1 is a block diagram of a high resolution timing device in an embodiment of the present invention.

FIG. 1 is a block diagram of a high resolution timing device 1 in an embodiment of the present invention. The high resolution timing device 1 includes a first clock delay circuit 10 and a second clock delay circuit 20.

The first clock delay circuit 10 includes a first phase-locked loop module 12 and a first clock delay module 14. The first phase-locked loop module 12 includes a voltage-controlled oscillating (VCO) unit 120, a frequency-dividing unit 122, a phase-detecting unit 124 and a charge pump 126.

The voltage-controlled oscillating unit 120 generates a first multiple frequency output clock signal 121 according to a control voltage V1. In an embodiment, the voltage-controlled oscillating unit 120 is implemented by a ring oscillator.

The frequency-dividing unit 122 divides the first multiple frequency output clock signal 121 to generate the first original frequency output clock signal 123. In an embodiment, the frequency-dividing unit 122 divides the first multiple frequency output clock signal 121 by a number to generate the first original frequency output clock signal 123. In an embodiment, the number is n. In other words the frequency of the first multiple frequency output clock signal 121 is n tines of the frequency of the first original frequency output clock signal 123.

The phase-detecting unit 124 receives the input reference clock signal 125 and the first original frequency output clock signal 123 to generate a frequency difference between the input reference clock signal 125 and the first original frequency output clock signal 123. The charge pump 126 further generates the control voltage V1 mentioned above according to the voltage difference. In an embodiment, the frequency of the first multiple frequency output clock signal 121 is n times of the frequency of the input reference clock signal 125.

As a result, the phase-detecting unit 124, the charge pump 126, the frequency-dividing unit 122 and the voltage-controlled oscillating unit 120 together form a feedback path. When the frequency of the first multiple frequency output clock signal 121 is lower than the n times of the frequency of the input reference clock signal 125, the frequency of the frequency-divided first original frequency output clock signal 123 becomes lower than the input reference clock signal 125. The phase-detecting unit 124 thus generates the control voltage V1 such that the frequency of the signal generated by the voltage-controlled oscillating unit 120 is increased. On the contrary, when the frequency of the first multiple frequency output clock signal 121 is higher than the n times of the frequency of the input reference clock signal 125, the frequency of the frequency-divided first original frequency output clock signal 123 becomes higher than the input reference clock signal 125. The phase-detecting unit 124 thus generates the control voltage V1 such that the frequency of the signal generated by the voltage-controlled oscillating unit 120 is decreased.

Consequently, the feedback path mentioned above keeps the frequency of the first multiple frequency output clock signal 121 at a value of n times of the frequency of the input reference clock signal 125.

In an embodiment, the first clock delay circuit 10 further includes a loop filter 128 to perform filtering on the control voltage V1. In an embodiment, the loop filter 128 filters out the alternating current (AC) or high frequency part of the control voltage V1 to avoid the interference of the noise caused thereby.

The first clock delay module 14 includes a shift register unit 140 and a multiplexer 142. In an embodiment, the shift register unit 140 includes a plurality of shift registers (not illustrated) and performs the clock-delaying process on the first original frequency output clock signal 123 according to the first multiple frequency output clock signal 121. In different embodiments, according to the ratio between the frequencies of the first multiple frequency output clock signal 121 and the first original frequency output clock signal 123 and the number of the shift registers, the shift register unit 140 can generate different numbers of first clock-delayed signals 141 that correspond to different phases. For example, when the frequency of the first multiple frequency output clock signal 121 is four times of the frequency of the first original frequency output clock signal 123, the shift register unit 140 can generate at most four first clock-delayed signals 141 having phases different from each other.

The multiplexer 142 selects one of the first clock-delayed signals 141 to be outputted as the first clock-delayed signals 141' and transmit the first clock-delayed signals 141' to the second clock delay circuit 20. In other words, the multiplexer 142 can select one of the first clock-delayed signals 141 having the phase that matches the need. In an embodiment, the first clock delay module 14 further includes a register unit 144 to store the first clock-delayed signals 141' and transmit the first clock-delayed signals 141' to the second clock delay circuit 20 subsequently. In an embodiment, the register unit 144 can be such as, but not limited to a D flip-flop.

Similar to the first clock delay circuit 10, the second clock delay circuit 20 includes a second phase-locked loop module 22 and a second clock delay module 24. The second phase-locked loop module 22 includes a voltage-controlled oscillating unit 220, a frequency-dividing unit 222, a phase-detecting unit 224 and a charge pump 226.

The voltage-controlled oscillating unit 220 generates a second multiple frequency output clock signal 221 according to a control voltage V2. In an embodiment, the voltage-controlled oscillating unit 220 is implemented by a ring oscillator.

The frequency-dividing unit 222 divides the second multiple frequency output clock signal 221 to generate the second original frequency output clock signal 223. In an embodiment, the frequency-dividing unit 222 divides the second multiple frequency output clock signal 221 by a number to generate the second original frequency output clock signal 223. In an embodiment, the number is such as but not limited to m. In other words, the frequency of the second multiple frequency output clock signal 221 is m times of the frequency of the second original frequency output clock signal 223.

The phase-detecting unit 224 receives the first clock-delayed signal 141 and the second original frequency output clock signal 223 to generate a frequency difference between the first clock-delayed signal 141 and the second original frequency output clock signal 223. The charge pump 226 further generates the control voltage V2 mentioned above according to the voltage difference. In an embodiment, the frequency of the second multiple frequency output clock signal 221 is m times of the frequency of the first clock-delayed signal 141'.

As a result, the phase-detecting unit 224, the charge pump 226, the frequency-dividing unit 222 and the voltage-controlled oscillating unit 220 together form a feedback path. When the frequency of the second multiple frequency output clock signal 221 is lower than the m times of the frequency of the first clock-delayed signal 141', the frequency of the frequency-divided second original frequency output clock signal 223 becomes lower than the first clock-delayed signal 141'. The phase-detecting unit 224 thus generates the control voltage V2 such that the frequency of the signal generated by the voltage-controlled oscillating unit 220 is increased. On the contrary, when the frequency of the second multiple frequency output clock signal 221 is higher than the m times of the frequency of the input reference clock signal 125, the frequency of the frequency-divided second original frequency output clock signal 223 becomes higher than the frequency of the first clock-delayed signal 141'. The phase-detecting unit 224 thus generates the control voltage V2 such that the frequency of the signal generated by the voltage-controlled oscillating unit 220 is decreased.

Consequently, the feedback path mentioned above keeps the frequency of the second multiple frequency output clock signal 221 at a value of m times of the frequency of the first clock-delayed signal 141'.

In an embodiment; the second clock delay circuit 20 further includes a loop filter 228 to perform filtering on the control voltage V2. In an embodiment, the loop filter 228 filters out the alternating current (AC) or high frequency part of the control voltage V2 to avoid the interference of the noise caused thereby.

The second clock delay module 24 includes a shift register unit 240 and a multiplexer 242. In an embodiment, the shift register unit 240 includes a plurality of shift registers (not illustrated) and performs the clock-delaying process on the second original frequency output clock signal 223 according to the second multiple frequency output clock signal 221. In different embodiments, according to the ratio between the frequencies of the second multiple frequency output clock signal 221 and the second original frequency output clock signal 223 and the number of the shift registers, the shift register unit 240 can generate different numbers of second clock-delayed signals 241 that correspond to different phases. For example, when the frequency of the second multiple frequency output clock signal 221 is four times of the frequency of the second original frequency output clock signal 223, the shift register unit 248 can generate at most four second clock-delayed signals 241 having phases different from each other.

The multiplexer 242 selects one of the second clock-delayed signals 241 to be outputted as the second clock-delayed signals 241'. In other words, the multiplexer 242 can select one of the second clock-delayed signals 241 having the phase that matches the need to be outputted. In an embodiment, the second clock delay module 24 further includes a register unit 244 to store the second clock-delayed signals 241' and output the second clock-delayed signals 241' subsequently. In an embodiment, the register unit 244 can be such as, but not limited to a D flip-flop.

In an embodiment, when an input period of the input reference clock signal is T, the ratio between the frequencies of the first multiple frequency output clock signal 121 and the input reference clock signal 125 is n, and the ratio between the frequencies of the second multiple frequency output clock signal 221 and the first clock-delayed signal 141 is m, a maximum resolution of the second clock-delayed signal 241' relative to the input reference clock signal 125 is $T/(n*m)$.

Figure 2A:
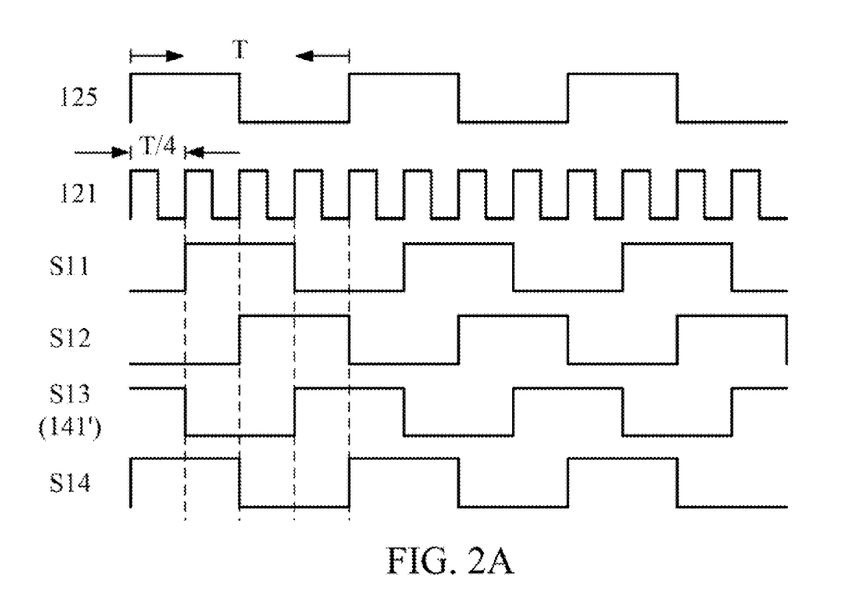
FIG. 2A is a diagram of the waveforms of the input reference clock signal the first multiple frequency output clock signal and a plurality of first clock-delayed signals in an embodiment of the present invention.

FIG. 2A is a diagram of the waveforms of the input reference clock signal 125, the first multiple frequency output clock signal 121 and a plurality of first clock-delayed signals S11-S14 in an embodiment of the present invention.

In an embodiment, the number n is 4. In other words, the frequency of the first multiple frequency output clock signal 121 is four times of the frequency of the input reference clock signal 125. Hence, when the period T of the input reference clock signal 125 is such as, but not limited to 20 nanoseconds (ns), the period of the first multiple frequency output clock signal 121 is T/n as illustrated in FIG. 2A, which is 20/4=5 ns. In the mean time, four first clock-delayed signals S11-S14 are generated according to the first multiple frequency output clock signal 121. Each of the two neighboring first clock-delayed signals S11-S14 are separated by 5 ns, wherein the first clock-delayed signal S14 is delayed by four units of time and has the same waveform as the input reference clock signal 125 since it is delayed by a time of the whole period of the input reference clock signal 125.

In an embodiment, the first clock-delayed signal S13 is selected as the outputted first clock-delayed signal 141', wherein the difference of the phase between the first clock-delayed signal 141' and the input reference clock signal 125 is 5*3=15 ns.

Figure 2B:
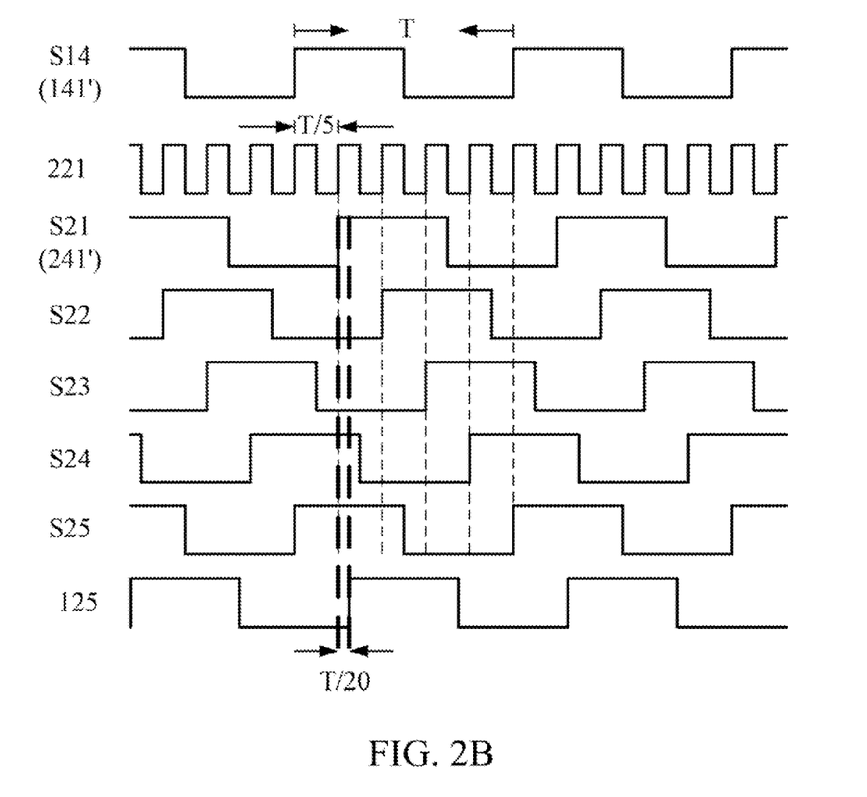
FIG. 2B is diagram of the waveforms of the first clock-delayed signal, the second multiple frequency output clock signal, a plurality of second clock-delayed signals and the input reference clock signal in an embodiment of the present invention.

FIG. 2B is diagram of the waveforms of the first clock-delayed signal S13 (i.e. 141'), the second multiple frequency output clock signal 221, a plurality of second clock-delayed signals S21-S25 and the input reference clock signal 125 in an embodiment of the present invention.

In an embodiment, the number m mentioned above equals to n+1, which is 5. In other words, the frequency of the second multiple frequency output clock signal 221 is five times of the frequency of the first clock-delayed signal S13. Hence, when the period T of the first clock-delayed signal S13 is such as, but not limited to 20 nanoseconds (ns), the period of the second multiple frequency output clock signal 221 is T/m as illustrated in FIG. 2B, which is 20/5=4 ns. In the mean time, five first clock-delayed signals S21-S25 are generated according to the second multiple frequency output clock signal 221. Each of the two neighboring second clock-delayed signals S21-S25 are separated by 4 ns, wherein the second clock-delayed signal S24 is delayed by five units of time and has the same waveform as the first clock-delayed signal 141' since it is delayed by a time of the whole period of the first clock-delayed signal 141'.

In an embodiment, the second clock-delayed signal S21 is selected as the outputted second clock-delayed signal 241', wherein the difference of the phase between the second clock-delayed signal 241' and the first clock-delayed signal S13 is 4 ns.

As result, the phase difference between the second clock-delayed signal S21 (i.e. 241') and the input reference clock signal 125 is 15+4=19 ns. In other words, the waveform of the second clock-delayed signal S21 is behind the waveform of the input reference clock signal 125 for 19 ns. However, since the period of the input reference clock signal 125 is 20 ns, the phase difference between the second clock-delayed signal S21 and the input reference clock signal 125 of the next corresponding period is 1 ns. The resolution of the original input reference clock signal 125 is the period T (i.e. 20 ns) thereof. The resolution of the signal generated by the high resolution timing device 1 is the difference of the phase between the second clock-delayed signal S21 and the original input reference clock signal 125, which is T/(n*m) (i.e. 1 ns). Consequently, the resolution becomes higher.

The advantage of the high resolution timing device 1 in the present invention is to make use of the design of the first clock delay circuit 10 and the second clock delay circuit 20 to generate multiple frequency signals according to the input reference clock signal 125 to perform clock-delaying process. The resolution between the clock-delayed signal and the input reference clock signal 125 is greatly increased such that the clock-delayed signal can be applied to sample other signals or perform clock-delaying process with a high accuracy.

Figure 3:
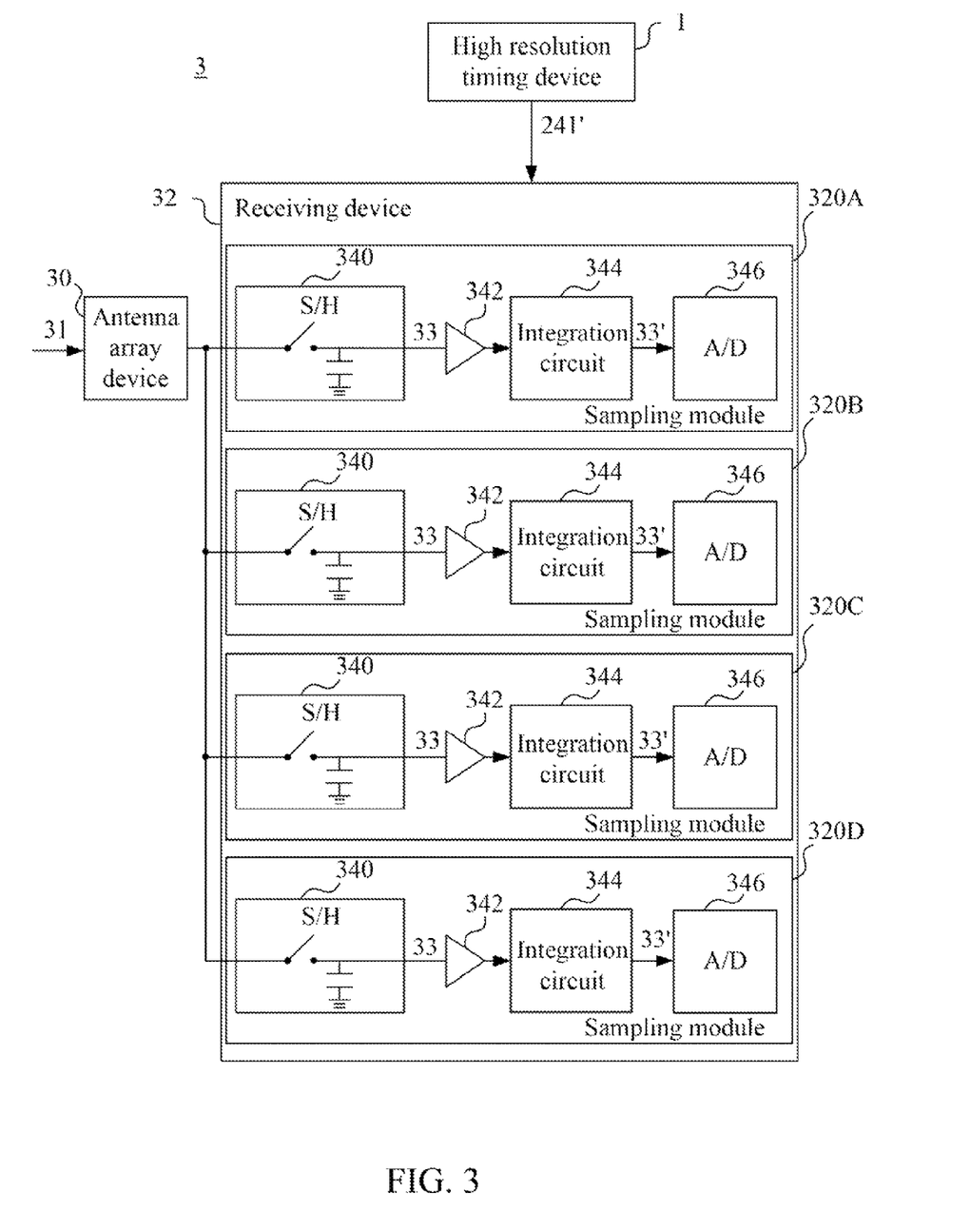
FIG. 3 is a block diagram of a radar detection system in an embodiment of the present invention.

FIG. 3 is a block diagram of a radar detection system 3 in an embodiment of the present invention. The radar detection system 3 includes the high resolution timing device 1 illustrated in FIG. 1 an antenna array device 30 and a receiving device 32.

The antenna array device 30 receives wireless input signals 31. In different embodiments, the antennas included in the antenna array device 30 can be different depending on the practical usage scenario.

The receiving device 32 includes sampling modules 320A-320D. It is noted that in different embodiments, the receiving device 32 can include different number of sampling modules and is not limited thereto.

The sampling modules 320A-320D are electrically connected to the antenna array device 30. Each of the sampling modules 320A-320D includes identical components. Take the sampling module 320A as an example, the sampling module 320A includes a sample-and-hold circuit 340 (labeled as S/H in FIG. 3), an amplifying circuit 342, an integration circuit 344 and an analog-to-digital conversion circuit 346 (labeled as A/D in FIG. 3).

The sample-and-hold circuit 340 samples one of the wireless input signals 31 according to the second clock-delayed signal 241 generated by the high resolution timing device 1 to performing a sampling process on the wireless input signal 31 to generate a sampled signal 33. The amplifying circuit 324 amplifies the sampled signal 33. The integration circuit 344 performs integration on the sampled signal 33 that is amplified according to the second clock-delayed signal 241' to generated an integrated sampled signal 33'. The analog-to-digital conversion circuit 346 performs an analog-to-digital conversion on the sampled signal 33' that is integrated according to the second clock-delayed signal 241'. In an embodiment, the sampled signal 33' can be transmitted to a processing device (not illustrated) of the radar detection system 3 to perform further processing.

In an embodiment, the sampling modules 320A-320D are electrically connected to a single antenna of the antenna array device 30 and receive different second clock-delayed signals 241' having different phases from the high resolution timing device 1 to perform sampling processes on the wireless input signal 31 received by the single antenna based on different phases of the second clock-delayed signals 241'. As a result, the sampling accuracy of the wireless input signal 31 is greatly increased.

In another embodiment, the sampling modules 320A-320D are electrically connected to different antennas of the antenna array device 30 and perform sampling processes on the wireless input signal 31 received by the different antennas based on different second clock-delayed signals 241'.

Figure 4:
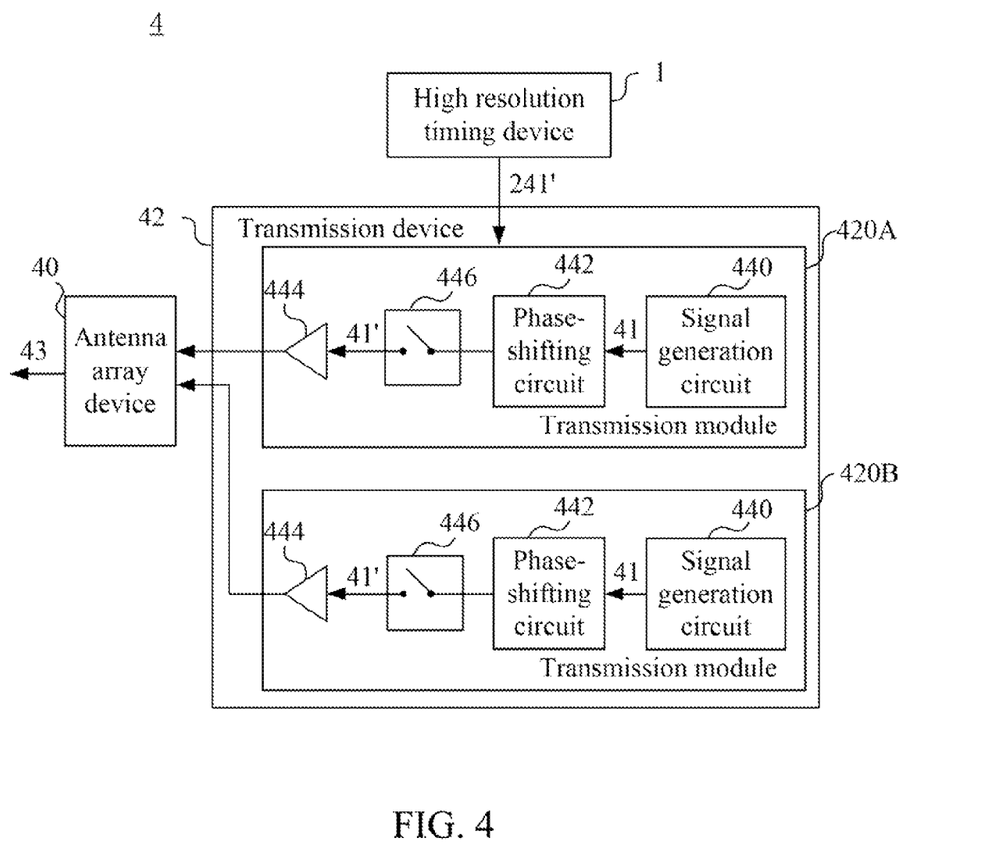
FIG. 4 is a block diagram of a radar detection system in an embodiment of the present invention.

FIG. 4 is a block diagram of a radar detection system 4 in an embodiment of the present invention. The radar detection system 4 includes the high resolution timing device 1 illustrated in FIG. 1, an antenna array device 40 and a transmission device 42.

The transmission device 42 includes transmission modules 420A-420B. It is noted that in different embodiments, the transmission device 42 can include different number of transmission modules and is not limited thereto.

The transmission modules 420A-420B are electrically connected to the antenna array device 40. Each of the transmission modules 420A-420B includes identical components. Take the transmission modules 420A as an example, the transmission modules 420A includes a signal generation circuit 440, a phase-shifting circuit 442 and a power-amplifying circuit 444.

The signal generation circuit 440 generates an output signal 41 according to the second clock-delayed signal 241'. The phase-shifting circuit 442 performs a phase-shifting process on the output signal 41' according to the second clock-delayed signal 241'. The power-amplifying circuit 444 performs a power-amplifying process on the output signal 41' that is phase-shifted such that the antenna array device 40 generates the wireless output signal 43 according to the output signal 41'.

In an embodiment, the transmission module 420A further includes a switch circuit 446 to transmit the output signal 41' to the power amplifying circuit 444 to perform the power-amplifying process such that the antenna array device 40 generates the wireless output signal 43 at a proper timing according to the second clock-delayed signal 241'.

It is noted that the transmission device 42 can be disposed in the radar detection system 3 illustrated in FIG. 3 such that the radar detection system 3 can perform the transmission and receiving of the wireless signals according to the operation of the antenna array device 30, the receiving device 32 and the transmission device 42 to accomplish a radar detection mechanism.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A high resolution timing device, comprising:
    a first clock delay circuit comprising:
        a first phase-locked loop module to receive an input reference clock signal having an input frequency to generate a first multiple frequency output clock signal having a first frequency of a first multiple of the input frequency, and to divide the first multiple frequency output clock signal to generate a first original frequency output clock signal having the input frequency; and
        a first clock delay module to receive the first multiple frequency output clock signal and the first original frequency output clock signal so as to perform a clock-delaying process on the first original frequency output clock signal according to the first multiple frequency output clock signal to generate a plurality of first clock-delayed signals each having the input frequency; and a second clock delay circuit comprising:
a second phase-locked loop module to receive one of the first clock-delayed signals to generate a second multiple frequency output clock signal having a second frequency of a second multiple of the input frequency, and to divide the second multiple frequency output clock signal to generate a second original frequency output clock signal having the input frequency; and
a second clock delay module to receive the second multiple frequency output clock signal and the second original frequency output clock signal so as to perform the clock-delaying process on the second original frequency output clock signal according to the second multiple frequency output clock signal to generate a plurality of second clock-delayed signals each having the input frequency.

2. The high resolution timing device of claim 1, wherein the first phase-locked loop module comprises:
a voltage-controlled oscillating unit to generate the first multiple frequency output clock signal according to a control voltage;
a frequency-dividing unit to divide the first multiple frequency output clock signal to generate the first original frequency output clock signal; and
a phase-detecting unit to receive the input reference clock signal and the first original frequency output clock signal to generate the control voltage according to a frequency difference between the input reference clock signal and the first original frequency output clock signal.

3. The high resolution timing device of claim 2, wherein the first phase-locked loop module further comprises a loop filter to perform filtering on the control voltage.

4. The high resolution timing device of claim 1, wherein the first clock delay module comprises:
a shift register unit to perform the clock-delaying process on the first original frequency output clock signal according to the first multiple frequency output clock signal to generate the first clock-delayed signals; and
a multiplexer to select one of the first clock-delayed signals to be outputted to the second clock delay circuit.

5. The high resolution timing device of claim 1, wherein the second phase-locked loop module comprises:
a voltage-controlled oscillating unit to generate the second multiple frequency output clock signal according to a control voltage;
a frequency-dividing unit to divide the second multiple frequency output clock signal to generate the second original frequency output clock signal; and
a phase-detecting unit to receive one of the first clock-delayed signals and the second original frequency output clock signal to generate the control voltage according to a frequency difference between the one of the first clock-delayed signals and the second original frequency output cloak signal.

6. The high resolution timing device of claim 5, where the second phase-locked loop module further comprises a loop filter to perform filtering on the control voltage.

7. The high resolution timing device of claim 1, wherein the second clock delay module comprises:
a shift register unit to perform the clock-delaying process on the second original frequency output clock signal according to the second multiple frequency output clock signal to generate the second clock-delayed signals; and
a multiplexer to select one of the second clock-delayed signals to be outputted.

8. The high resolution timing device of claim 1, wherein the first multiple is n and the second multiple is m.

9. The high resolution timing device of claim 8, where when an input period of the input reference clock signal is T, a maximum resolution of the second clock-delayed signals is $T/(n*m)$.

10. A radar detection system comprising:
a high resolution timing device comprising:
a first clock delay circuit comprising:
a first phase-locked loop module to receive a input reference clock signal having an input frequency to generate a first multiple frequency output clock signal having a first frequency of a first multiple of the input frequency, and to divide the first multiple frequency output clock signal to generate a first original frequency output clock signal having the input frequency; and
a first clock delay module to receive the first multiple frequency output clock signal and the first original frequency output clock signal so as to perform a clock-delaying process on the first original frequency output clock signal according to the first multiple frequency output clock signal to generate a plurality of first clock-delayed signals each having the input frequency; and
a second clock delay circuit comprising:
a second phase-locked loop module to receive one of the first clock-delayed signals to generate a second multiple frequency output clock signal having a second frequency of a second multiple of the input frequency, and to divide the second multiple frequency output clock signal to generate a second original frequency output clock signal having the input frequency; and
a second clock delay module to receive the second multiple frequency output clock signal and the second original frequency output clock signal so as to perform the clock-delaying process on the second original frequency output clock signal according to the second multiple frequency output clock signal to generate a plurality of second clock-delayed signals each having the input frequency;
an antenna array device a plurality of wireless input signals; and
a receiving device comprising a plurality of sampling, modules electrically connected to the antenna array device to respectively sample the wireless input signals according to one of the second clock-delayed signals.

11. The radar detection system of claim 10, wherein each of the sampling modules comprises:
a sample-and-hold circuit to sample one of the wireless input signals according to one of the second clock-delayed signals to generate a sampled signal;
an amplifying circuit to amplify the sampled signal;
an integration circuit to perform integration on the sampled signal that is amplified according to one of the second clock-delayed signals; and
an analog-to-digital conversion circuit to perform an analog-to-digital conversion on the sampled signal that is integrated according to one of the second clock-delayed signals.

12. The radar detection system of claim 11, wherein at least one of the sampling modules corresponds to an antenna comprised in the antenna array device.

13. The radar detection system of claim 10, further comprising a transmission device comprising a plurality of transmission modules to respectively generate an output signal according to one of the second clock-delayed signals such that the antenna array device generates a wireless output signal according to the output signal.

14. The radar detection system of claim 13, wherein the transmission module further comprises:
- a signal generation circuit to generate the output signal according to one of the second clock-delayed signals;
- a phase-shifting circuit to perform a phase-shifting process on the output signal according to one of the second clock-delayed signals, and
- a power-amplifying circuit to perform a power-amplifying process on the output signal that is phase-shifted such that an antenna of the antenna array device generates the wireless output signal according to the output signal.

15. The radar detection system of claim 10, wherein the first phase-locked loop module comprises:
- a voltage-controlled oscillating unit to generate the first multiple frequency output clock signal according to a control voltage;
- a frequency-dividing unit to divide the first multiple frequency output clock signal to generate the first original frequency output clock signal; and
- a phase-detecting unit to receive the input reference clock signal and the first original frequency output clock signal to generate the control voltage according to a frequency difference between the input reference clock signal and the first original frequency output clock signal.

16. The radar detection system of claim 15, wherein the first phase-locked loop module further comprises a loop filter to perform filtering on the control voltage.

17. The radar detection system of claim 10, wherein the first clock delay module comprises:
- a shift register unit to perform the clock-delaying process on the first original frequency output clock signal according to the first multiple frequency output clock signal to generate the first clock-delayed signals; and
- a multiplexer to select one of the first clock-delayed signals to be outputted to the second clock delay circuit.

18. The radar detection system of claim 10, wherein the second phase locked loop module comprises:
- a voltage-controlled oscillating unit to generate the second multiple frequency output clock signal according to a control voltage;
- a frequency-dividing unit to divide the second multiple frequency output clock signal to generate the second original frequency output clock signal; and
- a phase-detecting unit to receive one of the first clock-delayed signals and the second original frequency output clock signal to generate the control voltage according to a frequency difference between the one of the first clock-delayed signals and the second original frequency output clock signal.

19. The radar detection system of claim 18, wherein the second phase-locked loop module further comprises a loop filter to perform filtering on the control voltage.

20. The radar detection system of claim 10, wherein the second clock delay module comprises:
- a shift register unit to perform the clock-delaying process on the second original frequency output clock signal according to the second multiple frequency output clock signal to generate the second clock-delayed signals; and
- a multiplexer to select one of the second clock-delayed signals to be outputted.

* * * * *